United States Patent
Tsukanov

(10) Patent No.: US 9,419,118 B1
(45) Date of Patent: Aug. 16, 2016

(54) TRENCH IGBT WITH TUB-SHAPED FLOATING P-WELL AND HOLE DRAINS TO P-BODY REGIONS

(71) Applicant: IXYS Corporation, Milpitas, CA (US)

(72) Inventor: Vladimir Tsukanov, Los Altos Hills, CA (US)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 14/931,426

(22) Filed: Nov. 3, 2015

(51) Int. Cl.
    *H01L 29/74* (2006.01)
    *H01L 29/10* (2006.01)
    *H01L 29/739* (2006.01)

(52) U.S. Cl.
    CPC ........ *H01L 29/7397* (2013.01); *H01L 29/1095* (2013.01)

(58) Field of Classification Search
    CPC .................... H01L 29/7397; H01L 29/1095
    See application file for complete search history.

(56) References Cited

U.S. PATENT DOCUMENTS

| | | | | |
|---|---|---|---|---|
| 2002/0179976 A1* | 12/2002 | Takahashi | ............. | H01L 29/407 257/370 |
| 2014/0084332 A1* | 3/2014 | Lee | ..................... | H01L 29/7397 257/139 |
| 2016/0027906 A1* | 1/2016 | Onozawa | .......... | H01L 29/66348 257/144 |
| 2016/0064476 A1* | 3/2016 | Kobayashi | .......... | H01L 29/7397 257/139 |

* cited by examiner

*Primary Examiner* — Christine Enad
(74) *Attorney, Agent, or Firm* — Imperium Patent Works; T. Lester Wallace

(57) ABSTRACT

A trench IGBT has a gate electrode disposed in a trench. A tub-shaped floating P-well is disposed on one side of the trench. The tub-shaped floating P-well has a central shallower portion and a peripheral deeper portion. An inner sidewall of the trench is semiconductor material of the peripheral deeper portion of the floating P-well. On the other side of the trench is a P type body region involving a plurality of deeper portions and a plurality of shallower portions. Each deeper portion extends to the trench such that some parts of the outer sidewall of the trench are semiconductor material of these deeper P-body portions. Other parts of the outer sidewall of the trench are semiconductor material of the shallower P-body portions. A shallow N+ emitter region is disposed at the top of the outer sidewall. The IGBT has fast turn off and enhanced on state conductivity modulation.

19 Claims, 9 Drawing Sheets

(PRIOR ART)
AVALANCHE BREAKDOWN
UNDER HIGH REVERSE VOLTAGE

REDUCED CURVATURE OF
OXIDE-TO-DRIFT BOUNDARY

REDUCED CURVATURE OF
OXIDE-TO-DRIFT BOUNDARY

CIRCUIT CAUSES GATE RINGING DURING TURN ON

GATE RINGING DURING TURN ON (PRIOR ART)
FARTHER DISTANCE – SLOWER TURN OFF

SHORTER DISTANCE – FASTER TURN OFF though the upper semiconductor surface of the die. FIG. 1B (Prior Art) is a cross-sectional diagram of the die taken along sectional line A-A' in FIG. 1A. The plane illustrated in top-down perspective in FIG. 1A is the plane taken along sectional line B-B' at the upper semiconductor surface in FIG. 1B. FIG. 1C (Prior Art) is a cross-sectional diagram taken along sectional line A-A" in FIG. 1A.

As shown in FIG. 1A, multiple octagonal trenches are formed down into the upper semiconductor surface of the die. These octagonal trenches are disposed in a matrix of rows and columns. A gate oxide layer lines the sidewalls of each trench. A gate electrode of polysilicon in turn is disposed on the oxide layer in the trench. Reference numeral 1 in FIG. 1A identifies a gate electrode.

Reference numeral 2 identifies a grid-shaped N+ type emitter region that extends across the upper surface of the die. The grid-shaped N+ type emitter region 2 has the form of a set of interconnected strips of N+ type semiconductor material as illustrated. A grid-shaped P type body region also extends across the upper surface of the die. The P type body region includes a shallower and more lightly P type doped portion 3A as well as multiple deeper and more heavily P+ type doped portions. As seen in the top-down diagram of FIG. 1A, the shallower more lightly doped portion 3A of the P body region has a grid-shape and can be visualized as involving a plurality of parallel-extending vertical strips and a plurality of intersecting parallel-extending horizontal strips. One of the deeper P+ doped portions, also referred to as a sinker, is disposed at each intersection where a vertical strip of the more lightly doped portion crosses a horizontal strip of the more lightly doped portion. These deeper more heavily doped P+ type regions therefore are arranged in a two-dimensional matrix of rows and columns. Reference numerals 3B1, 3B2 3B3 and 3B4 identify four of these more heavily doped regions. As shown in the cross-sectional diagrams of FIGS. 1B and 1C, N+ type semiconductor material of the emitter region 2 forms a part of the outer sidewall of each trench.

If an appropriate voltage is placed on the trench gate electrode 1, then a conductive channel is formed in the shallower portion 3A of the P type body region immediately adjacent the trench. This channel extends vertically between the N+ type emitter region 2 and the N-type drift region 4 in FIG. 1C. If a voltage is placed on the metal emitter terminal 5 with respect to the metal collector terminal 6, then electrons will flow from the N– type emitter region 2, down through the conductive channel, and to the N– drift layer 4. This flow of electrons contributes to the overall current flow between metal emitter terminal 5 and the metal collector terminal 6. As is known in the art, holes are also injected from the P++ collector layer 7 into the N+ buffer layer 8. This flow of holes serves to increase the concentration of holes in the N– drift layer which in turn through conductivity modulation serves to increase the concentration of electrons in the N– drift layer. A higher concentration of electrons in the N– drift layer means that more electron current can flow through the device. In addition, holes that escape from the N– drift layer also contribute to the overall current flow between metal emitter terminal 5 and the metal collector terminal 6. Due to some of the current carrying capacity of the IGBT die being due to electron current flow in one direction, and due to other of the current carrying capacity of the IGBT die being due to hole current flow in the other direction, the device is said to be "bipolar". The "B" in IGBT stands for bipolar.

In addition to these regions of the conventional trench IGBT of FIG. 1A, the convention IGBT die also includes numerous octagonal-shaped floating P well regions. There is one such octagonal-shaped floating P well region surrounded by each of the octagonal trenches. Reference numeral 9 identifies one such floating P well region.

If the trench IGBT is in the off state, and if a large reverse voltage is placed across the IGBT between the collector and emitter terminals, then there will be depletion regions formed on either side of the PN junction between the P body region and the N– drift layer. If the reverse voltage is great enough, silicon in the N– drift layer might suffer localized instances of avalanche breakdown. When avalanche breakdown occurs, electron/hole pairs are produced. Due to the reverse voltage across the device, the electrons flow downward toward the collector, and the holes flow in the opposite direction upward toward the emitter. If avalanche breakdown occurs around the gate oxide, the gate oxide can be damaged. As is known in the art, the junctions between the more heavily doped P+ portions of the P body region and the N– drift layer are therefore fashioned with a convex curvature to have a lower localized avalanche breakdown voltage. If avalanche breakdown were to occur, it would then occur close to these locations and not close to the fragile gate oxide. Reference numeral 10 in FIG. 1B identifies this PN junction. This PN junction is designed to withstand the high currents associated with an avalanche breakdown episode. The deeper P+ type body region 3B1 with its convex curvature is therefore deliberately placed a substantial distance away from the relatively fragile gate oxides so that avalanche breakdown and its adverse effects will be kept away from the gate oxide. In the diagram of FIG. 1B, the avalanche breakdown junction 10 is laterally spaced and separated both from the gate oxide layer of gate electrode 1 to the left, as well as from the gate oxide layer of the gate electrode 11 to the right.

The trench IGBT structure of FIGS. 1A, 1B and 1C sees widespread use and is considered to work well.

SUMMARY

A trench IGBT die structure has a plurality of tub-shaped floating P-wells that are formed down into an N-type drift layer from an upper semiconductor surface of the die. Each tub-shaped floating P-well includes a central shallower P type portion and a peripheral deeper P+ type portion. P+ type semiconductor material of the peripheral deeper P+ type portion of the floating P-well is the semiconductor material of the inner sidewall of a trench.

On the opposite side of the trench from the floating P-well is a P-body region. The P-body region includes a plurality of P+ type deeper portions and a plurality of P type shallower portions. P+ type semiconductor material of the P+ type deeper portions forms first parts of the outer sidewall of the trench. These first parts serve as drains through which holes can drain from the floating P-well, under the trench, and to the P-body region, when the floating P-well to N– drift PN junction undergoes depletion as the IGBT is being turned off. During steady on state operation of the IGBT, the tub-shape of the floating P-well helps to trap holes and to prevent their escape from the N− drift layer under the floating P-well, thereby promoting conductivity modulation during the IGBT on state. P type semiconductor material of the P type shallower portions of the P-body region forms second parts of the outer sidewall of the trench. These second parts serve as sidewall regions where conductive channels can form, under influence from a trench gate electrode in the trench.

N+ type semiconductor material of a shallow N+ type emitter region is disposed along the outer sidewall of the trench at the upper semiconductor surface of the die structure. N+ type semiconductor material of the shallow N+ type emitter region is the semiconductor material of the upper surface part of the outer sidewall of the trench. The deeper P+ type portions of the floating P-well on one side of the trench and the deeper P+ type portions of the P-body region on the opposite side of the trench extend downward into the IGBT die structure from the upper semiconductor surface a second distance D2. The trench extends down into the IGBT die structure from the upper semiconductor surface a first distance D1. Distance D2 is greater than distance D1. The trench gate electrode is disposed in the trench, with a gate oxide layer separating the trench gate electrode from the trench sidewalls and bottom.

In one example, P+ type semiconductor material of the peripheral deeper P+ type portion of the floating P-well extends under a first part (an inner part) of the bottom of the trench, and P+ type semiconductor material of the deeper P+ type portions of the P-body region extends under second parts (outer parts) of the bottom of the trench. The distance between the P+ material of the floating P-well and P+ material of the P-body region is smaller than the width of the trench.

In one example, the floating P-well has an octagonal shape when the IGBT die is considered from a top-down perspective. The trench, which also has an octagonal shape, rings and surrounds the octagonal floating P-well in the lateral dimension so that the inner sidewall of the trench is P+ type material of the peripheral P+ type deeper portion of the floating P-well. The shallow N+ type emitter has a strip-shape, and rings and surrounds the outside of the octagonal trench up at the upper semiconductor surface. There are four deeper P+ type portions of the P-body region, and each of these deeper P+ type portions contacts the octagonal trench so that P+ type semiconductor material of a deeper portion is semiconductor material of the trench sidewall at four corner locations around the periphery of the trench. Each adjacent pair of these deeper P+ type portions of the P-body region is coupled together by an intervening shallower P type portion of the P-body region. The overall trench IGBT die structure includes many such octagonal trenches and associated structures, organized in rows and columns across the upper surface of the die structure.

A metal emitter terminal at the top of the die makes contact with the N+ emitter region and with the P-body region. A metal gate terminal at the top of the die makes contact with the trench gate electrodes. Below the N-drift layer is an optional N+ type buffer layer, a P++ type collector layer, and a metal collector terminal.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "upper", "top", "up", "down", "vertically", "laterally", "lower", "bottom", and "backside" are used herein to describe relative orientations between different parts of the structure being described, and it is to be understood that the overall structure being described can actually be oriented in any way in three-dimensional space. The notations N+, N−, N, P++, P+, and P are only relative, and are to be considered in context, and do not denote any particular dopant concentration range. A region denoted generally in the claims to be "P type", however, is being indicated to be P type doped, and may be lightly doped, moderately doped, or heavily doped with P type dopants. Similarly, a region denoted in the claims to be N type is being indicated to be N type doped, and may be lightly doped, moderately doped, or heavily doped with N type dopants.

Figure 2A:
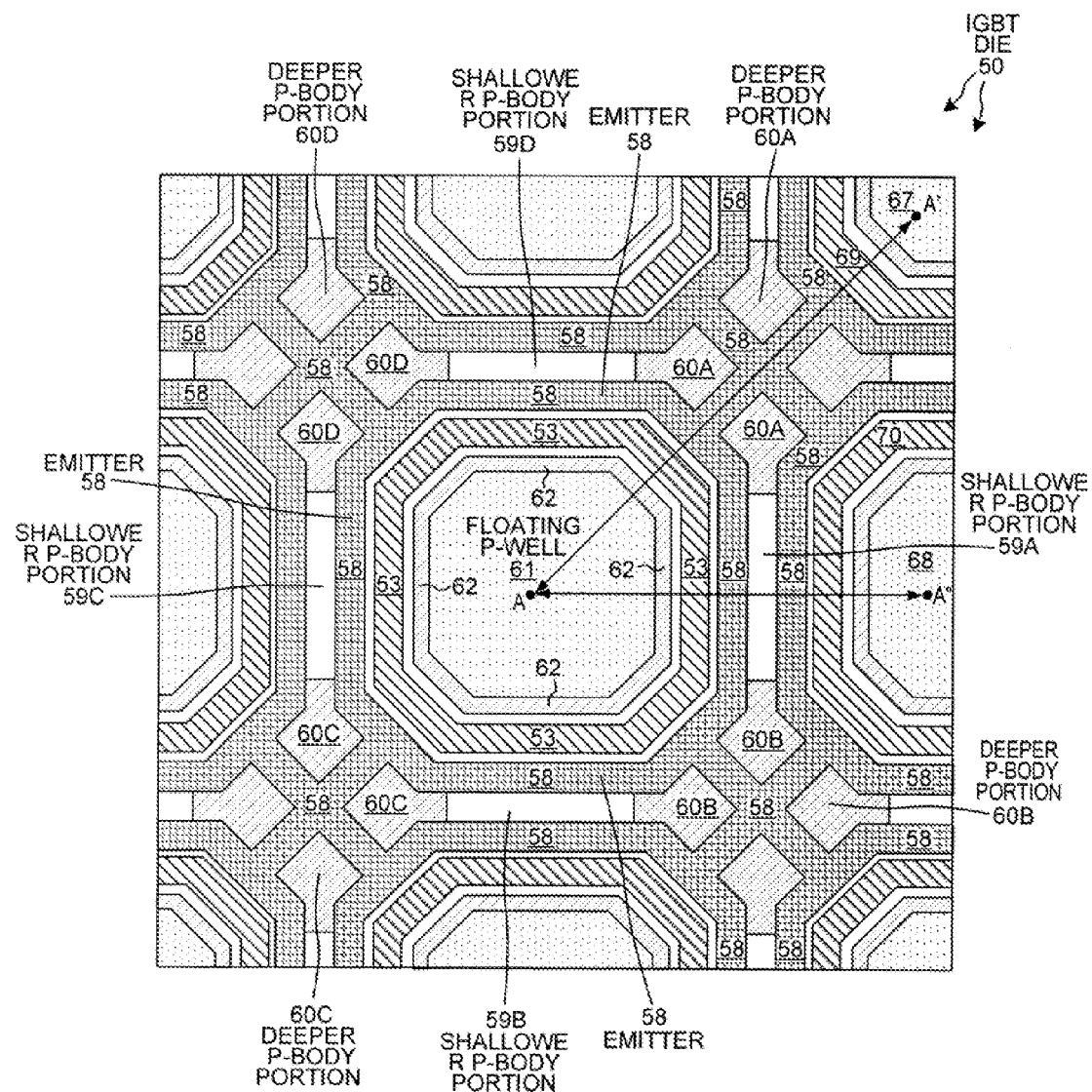
FIG. 2A is a top-down diagram of a square portion of the top of a trench IGBT die in accordance with one novel aspect.
Figure 2B:
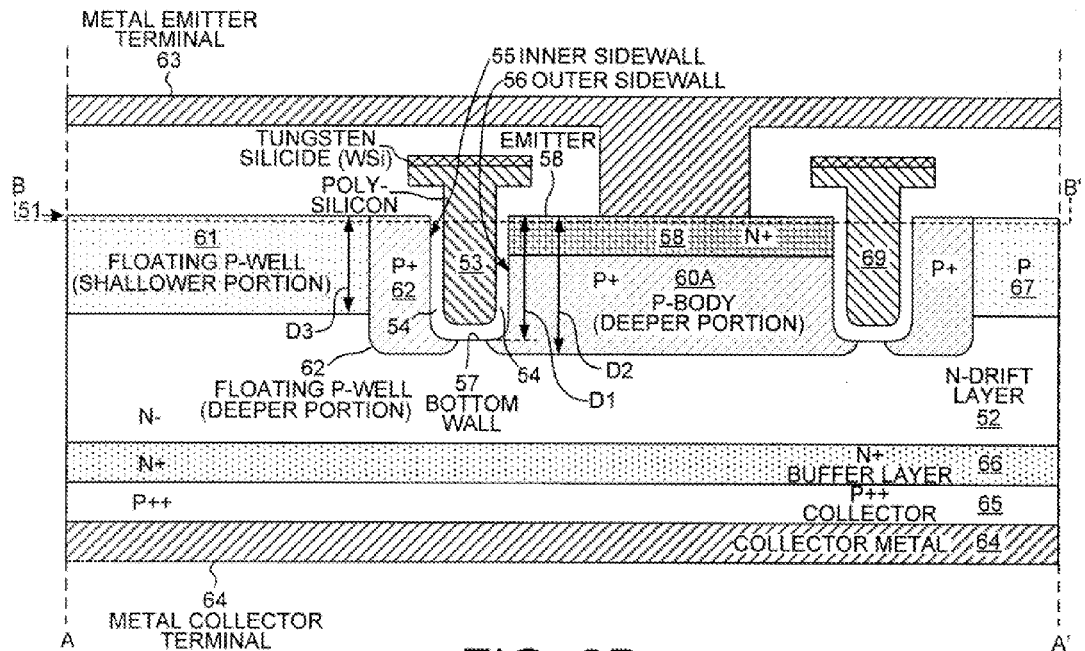
FIG. 2B is a cross-sectional diagram taken along sectional line A-A' of the novel IGBT of FIG. 2A.
Figure 2C:
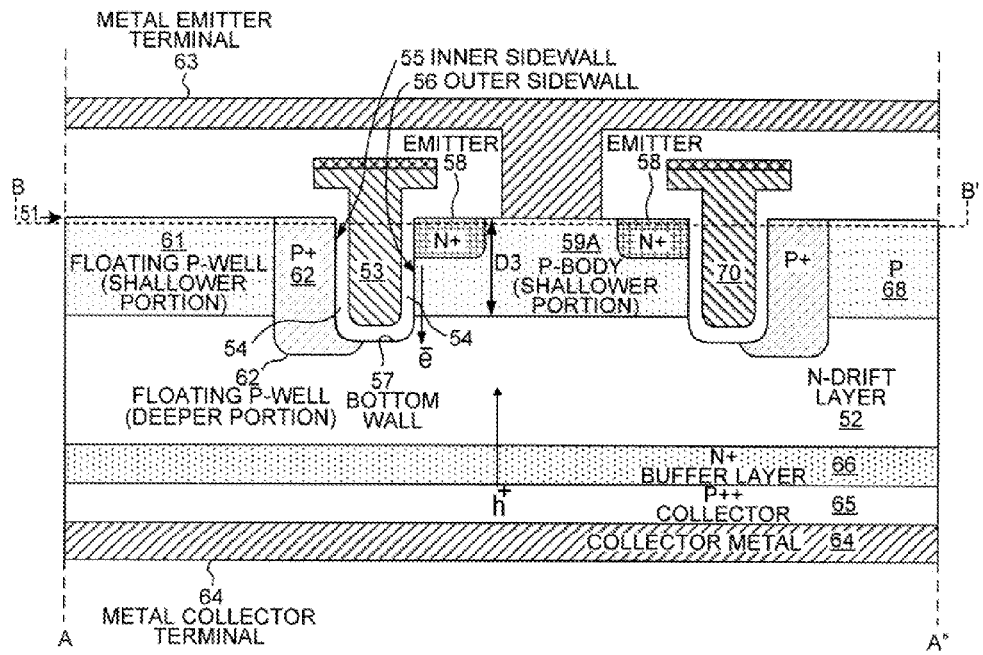
FIG. 2C is a cross-sectional diagram taken along sectional line A-A" of the novel IGBT of FIG. 2A.

FIG. 2A is a top-down diagram of a square portion of a trench-type Insulated Gate Field Effect (IGBT) die 50 in accordance with one novel aspect. The square portion illustrated in FIG. 2A is replicated in rows and columns across the upper face of the trench IGBT die. FIG. 2B is a cross-sectional diagram of the die taken along sectional line A-A' in FIG. 2A. The plane illustrated in top-down perspective in FIG. 2A is the plane taken along sectional line B-B' at the upper semiconductor surface in FIG. 2B. FIG. 2C is a cross-sectional diagram taken along sectional line A-A" in FIG. 2A.

As shown in FIG. 2A, there are octagonal trenches formed down into the upper semiconductor surface of the die. Each octagonal trench is 0.8 microns wide and extends a first distance D1 down from the upper semiconductor surface 51 toward the N− type drift layer 52. These octagonal trenches are disposed in a matrix of rows and columns. A gate oxide layer lines the sidewalls of each trench. Reference numeral 53 in FIG. 2A identifies a gate electrode of polysilicon that is disposed on the gate oxide layer in one such octagonal trench in the center of FIG. 2A. In FIG. 2B and FIG. 2C, reference numeral 54 identifies the gate oxide layer, reference numeral 55 identifies the inner sidewall of the trench, reference numeral 56 identifies the outer sidewall of the trench, and reference numeral 57 identifies the bottom wall of the trench.

A grid-shaped N+ type emitter region 58 extends across the upper surface of the die. The grid-shaped N+ type emitter region 58 has the form of a set of interconnected strips of N+ type semiconductor material as illustrated. As shown in the cross-sectional diagrams of FIG. 2B and FIG. 2C, N+ type semiconductor material of the N+ emitter region 58 rings and surrounds each octagonal trench at the upper semiconductor surface 51. N+ type semiconductor material of the emitter region 58 forms a part of the outer sidewall 56 of the trench.

A grid-shaped P type body region also extends across the upper surface of the die. The grid-shaped P type body region includes multiple shallower and more lightly doped P type portions as well as multiple deeper and more heavily doped P+ type portions. In the top-down diagram of FIG. 2A, reference numerals 59A, 59B, 59C and 59D identify four of the shallower and more lightly doped P type portions. Reference numerals 60A, 60B, 60C and 60D identify four of the deeper and more heavily doped P+ type portions. As shown in FIG. 2C, the shallower more lightly doped P type portions extend a third distance D3 downward from the upper semiconductor surface 51 toward the N− type drift layer 52. As shown in FIG. 2B, the deeper and more heavily doped P+ type portions extend a second distance D2 downward from the upper semiconductor surface 51 toward the N− type drift layer 52. As seen in the top-down diagram of FIG. 2A, the deeper P+ type portions are arranged in a two-dimensional matrix of rows and columns. Adjacent ones of the deeper P+ type regions are interconnected to each other by a strip-shaped more lightly doped portion. For example, vertically extending lightly doped P type region 59A extends between deeper P+ type portion 60A and deeper P+ type portion 60B. Horizontally extending lightly doped P type region 59B extends between deeper P+ type portion 60B and deeper P+ type portion 60C. Vertically extending lightly doped P type portion 59C extends between deeper P+ type portion 60C and deeper P+ type portion 60D. Horizontally extending lightly doped P type portion 59D extends between deeper P+ type portion 60D and deeper P+ type portion 60A. These shallower more lightly doped P type portions and these deeper more heavily doped P+ type portions together form the overall grid-shaped P body region. Accordingly, as indicated in FIG. 2A, FIG. 2B and FIG. 2C, P type semiconductor material of deeper more heavily doped P+ type portions forms four portions of the outer sidewall 56 of the trench shown in the center of FIG. 2A, whereas P type semiconductor material of shallower more lightly doped P type portions forms four other portions of the outer sidewall 55 of the trench.

The novel trench IGBT die 50 also includes numerous octagonal-shaped floating P well regions. There is one such octagonal-shaped floating P well region surrounded by each of the octagonal trenches. Each of these floating P well regions includes a central octagonal-shaped shallower floating P type well portion, as well as a peripheral deeper P+ type portion. For example, the floating P well 61/62 that is surrounded by octagonal trench and gate electrode 53 in the center of FIG. 2A includes the central shallower floating P type well portion 61 and the peripheral deeper P+ type portion 62. The shallower portion 61 of the floating P well extends downward from the upper semiconductor surface 51 the third distance D3, whereas the deeper portion 62 of the floating P well extends downward from the upper semiconductor surface 51 the second distance D2. As shown in FIGS. 2B and 2C, the peripheral deeper P+ type portion 62 of the floating P well forms the entire inner sidewall 55 of the trench. Within the confines of the octagonal trench, there is no N type semiconductor region that extends downward into any of the floating P type well regions from the substantially planar upper semiconductor surface.

In a transistor on state, a voltage is placed on the trench gate electrode 53 that causes a conductive channel to be formed in the outer sidewall 56 of the trench. This channel extends vertically between the N+ type emitter region 58 and the N− type drift layer 52 in FIG. 2C. If a positive voltage is placed on the metal collector terminal 64 with respect to the metal emitter terminal 63, then electrons will flow from the N− type emitter region 58, down through the conductive channel, and to the N− drift layer 52. This flow of electrons contributes to the overall current flow from the metal collector terminal 64 and to the metal emitter terminal 63. Holes are also injected from the P++ collector layer 65 into the N+ buffer layer 66. This flow of holes serves to increase the concentration of holes in the N− drift layer which in turn through conductivity modulation serves to increase the concentration of electrons in the N− drift layer. A higher concentration of electrons in the N− drift layer means that more electron current can flow through the device. In addition, holes that escape from the N− drift layer also contribute to the overall current flow between metal emitter terminal 63 and the metal collector terminal 64.

Figure 1A:
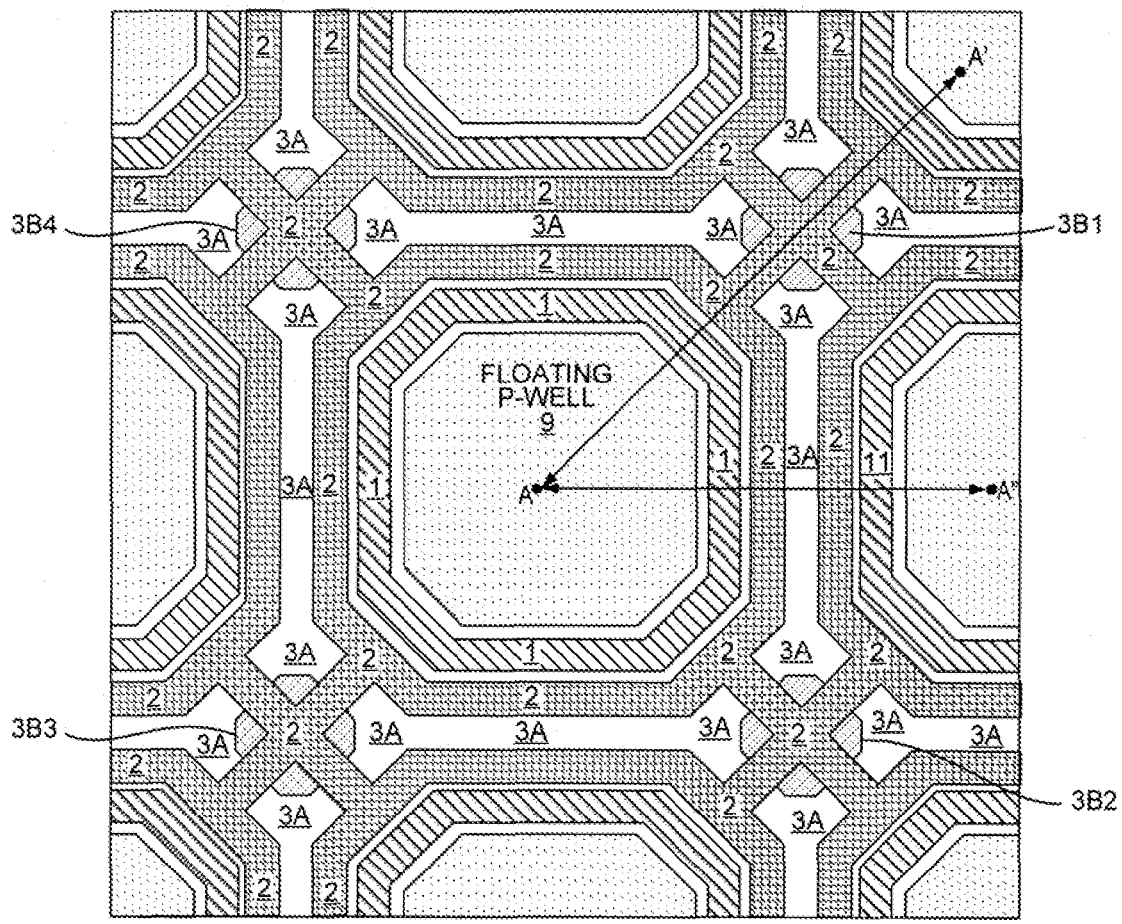
FIG. 1A (Prior Art) is a top-down diagram of a square portion of the top of a trench IGBT die.
Figure 1B:
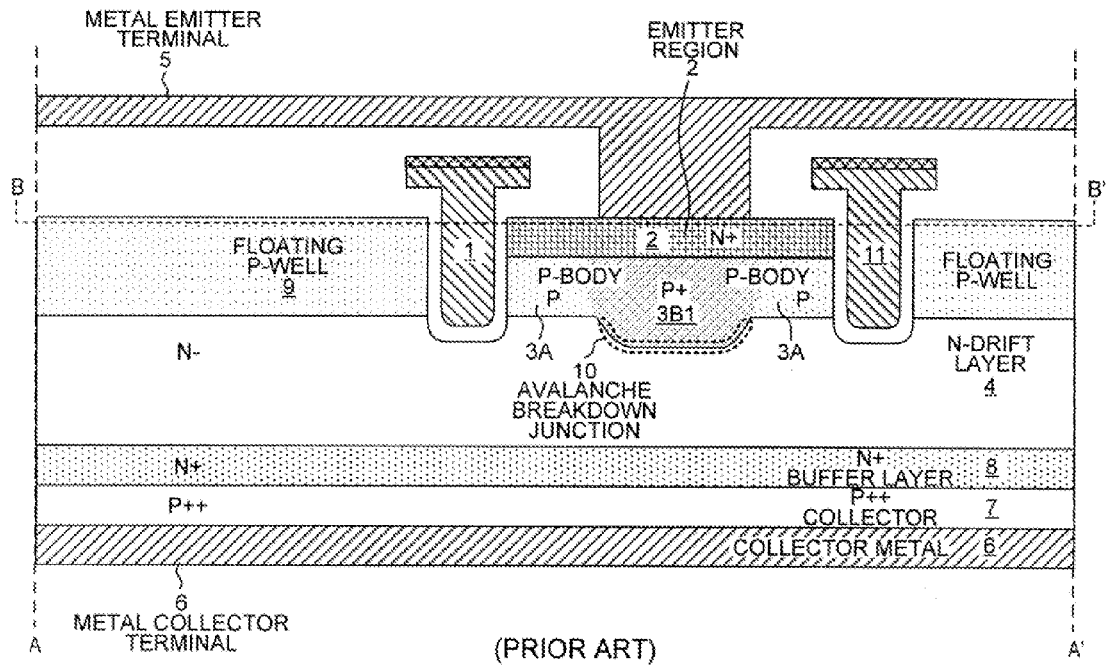
FIG. 1B (Prior Art) is a cross-sectional diagram taken along sectional line A-A' of the prior art IGBT of FIG. 1A.
Figure 1C:
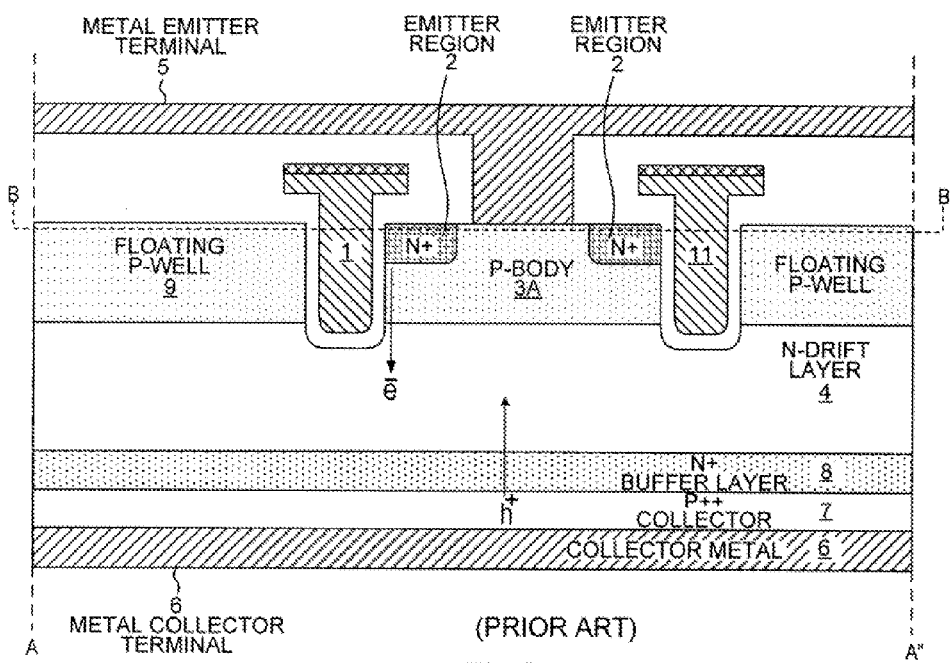
FIG. 1C (Prior Art) is a cross-sectional diagram taken along sectional line A-A" of the prior art IGBT of FIG. 1A.

Unlike the conventional IGBT structure of FIGS. 1A, 1B and 1C where the P+ type deep sinkers do not extend laterally out to the outer sidewall of any octagonal trench in any location, in the novel IGBT structure of FIG. 2A, FIG. 2B and FIG. 2C P+ type semiconductor material of four deeper P+ type portions 60A, 60B, 60C and 60D of the P body region do extend to the outer sidewall 56 of the trench that contains the gate electrode 53. As shown in the cross-sectional diagram of FIG. 2B, deeper P+ type portion 60A of the P body region forms a portion of outer sidewall 56 of the trench. The depth D2 of the deeper P+ type portion 60A is greater than the depth D1 of the trench, and some P+ type material of the P body region extends under an outer part of the bottom of the trench at the location shown in FIG. 2B. This structural feature exists at each of the four corners of the octagonal trench where the trench is bounded by a deeper portion of the P body region.

Unlike the conventional IGBT structure of FIGS. 1A, 1B and 1C where the floating P well is all of a uniform thickness, in the novel IGBT structure of FIG. 2A, FIG. 2B and FIG. 2C the floating P well 61/62 has an inverted bath tub shape or an inverted cup shape. The peripheral deeper P+ type portion 62 forms a sort of curtain that extends downward around the octagonal periphery of the central shallower portion 61. P+ type semiconductor material of the peripheral deeper portion 62 of the floating P well forms the entire inner sidewall 55 of the trench. As shown in FIG. 2B and FIG. 2C, some P+ type material of the floating P well extends under an inner part of the bottom of the trench. As shown in the cross-sectional diagram of FIG. 2B, even though P+ type material of the P body region extends under the outer portion of the bottom of the trench, and even though P+ type material of the floating P well region extends under the inner portion of the bottom of the trench, an amount of N– type semiconductor material of the N– drift layer still forms a part of the bottom wall of the trench. The amount of N– type semiconductor material separates the floating P well from the P body region beneath the bottom of the trench.

Figure 3:
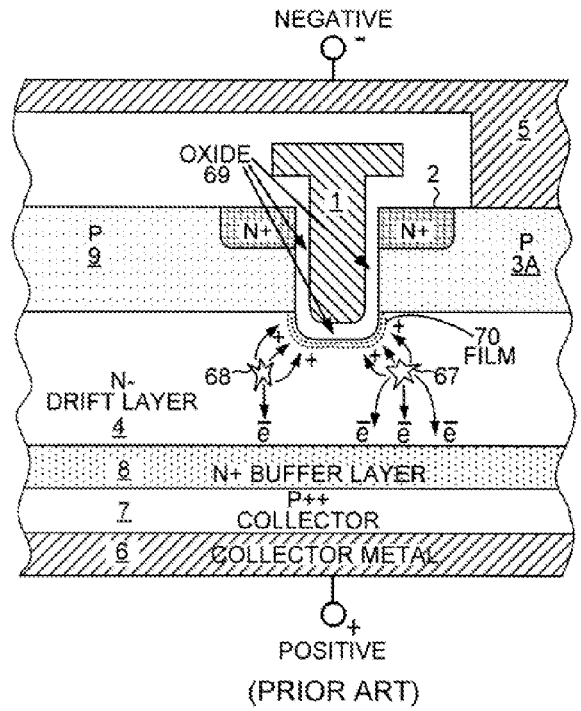
FIG. 3 is a cross-sectional diagram that illustrates avalanche breakdown in a prior art IGBT structure.
Figure 4:
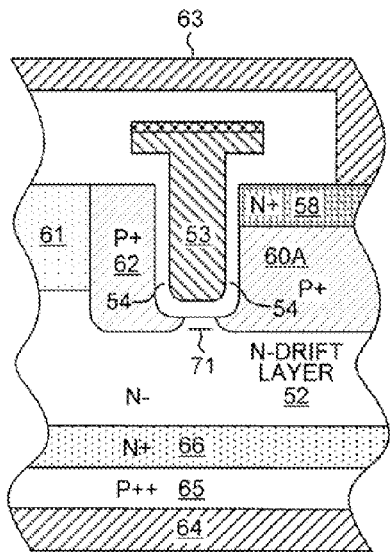
FIG. 4 is a cross-sectional diagram that shows how curvature of the oxide-to-N-drift layer boundary is reduced in the trench IGBT of FIG. 2A, FIG. 2B and FIG. 2C.
Figure 5:
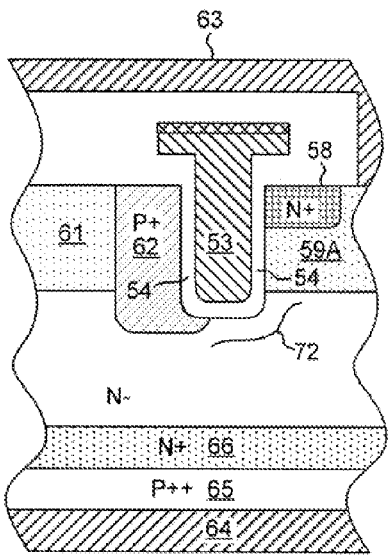
FIG. 5 is a cross-sectional diagram that shows how curvature of the oxide-to-N-drift layer boundary is reduced in the trench IGBT of FIG. 2A, FIG. 2B and FIG. 2C.

A first problem with the prior art trench IGBT structure is set forth in FIG. 3. Under high reverse voltages, avalanche breakdown may occur such as, for example, at locations 67 and 68. If the boundary between the trench oxide 69 and the N– drift layer 4 has a convex curvature such as shown in FIG. 3, then holes that are moving upward due to the relative negative voltage on the metal emitter terminal 5 with respect to the metal collector terminal 6 may be drawn to and accumulate in a thin region 70 at the point of highest convex curvature. With enough hole accumulation, the region 70 of N– drift semiconductor material suffers local inversion. As a result, there is local collapse of the breakdown voltage. Rather than avalanche occurring at the same time many places across the device so as to spread the effects of avalanche current flow, avalanche becomes extreme at the point where the breakdown voltage is the lowest. This results in too much local current, and catastrophic failure of the device. The novel trench IGBT structure 50 of FIG. 2A, FIG. 2B and FIG. 2C reduces the severity of this problem by reducing the degree and amount of convex curvature of the boundary between the trench oxide and the N– drift layer. FIG. 4 illustrates the reduced curvature along the sectional line A-A' in FIG. 2A. The line 71 represents the curvature of the boundary. FIG. 5 illustrates the reduced curvature along the sectional line A-A" in FIG. 2A. The line 72 represents the curvature of the boundary. The curvature of the left-bottom edge of the trench in FIG. 5 is covered by the P+ region 62 so the amount of convex oxide-to-drift boundary is reduced as compared to the prior art trench IGBT structure shown in FIG. 3.

Figure 6:
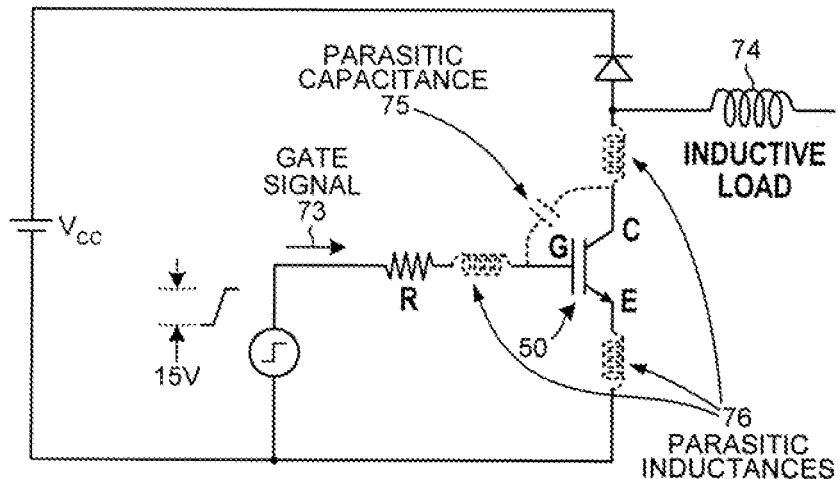
FIG. 6 is a circuit diagram of a circuit that results in harmful gate voltage ringing.
Figure 7:
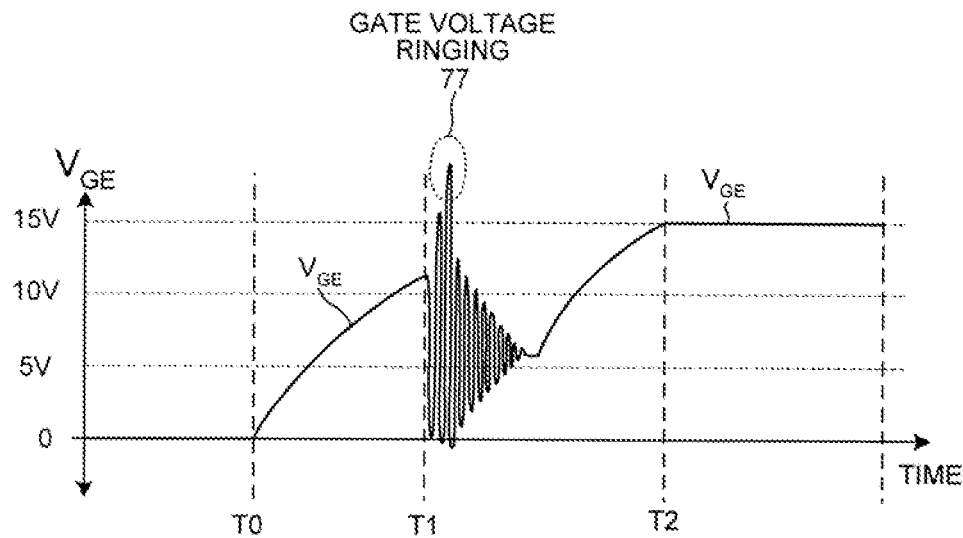
FIG. 7 is a waveform diagram that illustrates gate voltage ringing on the gate of the IGBT of FIG. 6.

A second problem with the prior art trench IGBT structure is described in connection with FIG. 6 and FIG. 7. The circuit of FIG. 6 has no free-wheeling diode. The trench IGBT 50 is initially off. Its gate-to-emitter voltage $V_{GE}$ is initially zero. The trench IGBT is then to be turned on starting at time T0. The gate signal 73 switches from zero volts to a higher voltage, such as 15 volts. The gate-to-emitter voltage at the IGBT, however, may appear as shown in FIG. 7. The voltage $V_{GE}$ increases to the point that the IGBT turns on and begins to conduct substantial current at time T1. This sudden surge of collector current causes a sudden voltage drop across the load 74. The sudden decrease in the voltage on the collector, however, is transferred through the parasitic capacitance 75 onto the gate of the IGBT. The gate voltage is pushed down along with the collector voltage. This reduction in gate voltage serves to turn the IGBT off momentarily, which in turns causes the collector voltage to spike up again. The parasitic inductances 76 and the parasitic capacitance 75 ring. If conditions are right, the gate voltage $V_{GE}$ may bounce up to a harmfully high voltage 77. This high voltage 77 causes high electric fields in the gate oxide of the IGBT and may damage the gate oxide. The novel trench IGBT structure 50 of FIG. 2A, FIG. 2B and FIG. 2C reduces the severity of this problem by reducing the susceptibility of the oxide-to-drift boundary to damage under such ringing conditions. The susceptibility of the boundary to damage is reduced, without increasing gate oxide thickness and reducing IGBT threshold voltage, by reducing the degree to which the boundary is convex, and by reducing the overall amount of oxide-to-drift boundary.

Figure 8:
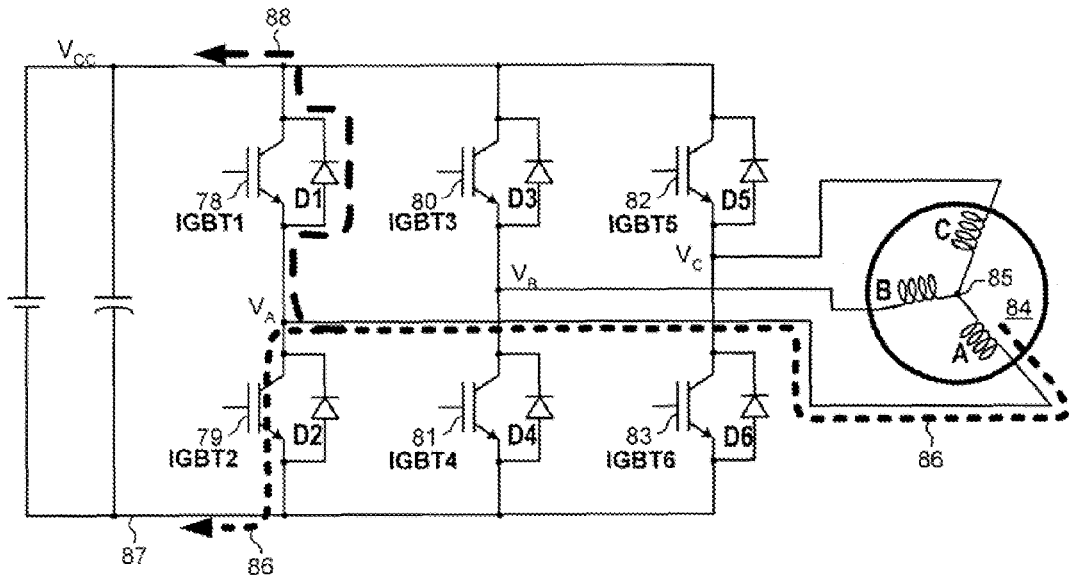
FIG. 8 is a circuit diagram of an IGBT motor drive circuit.
Figure 9:
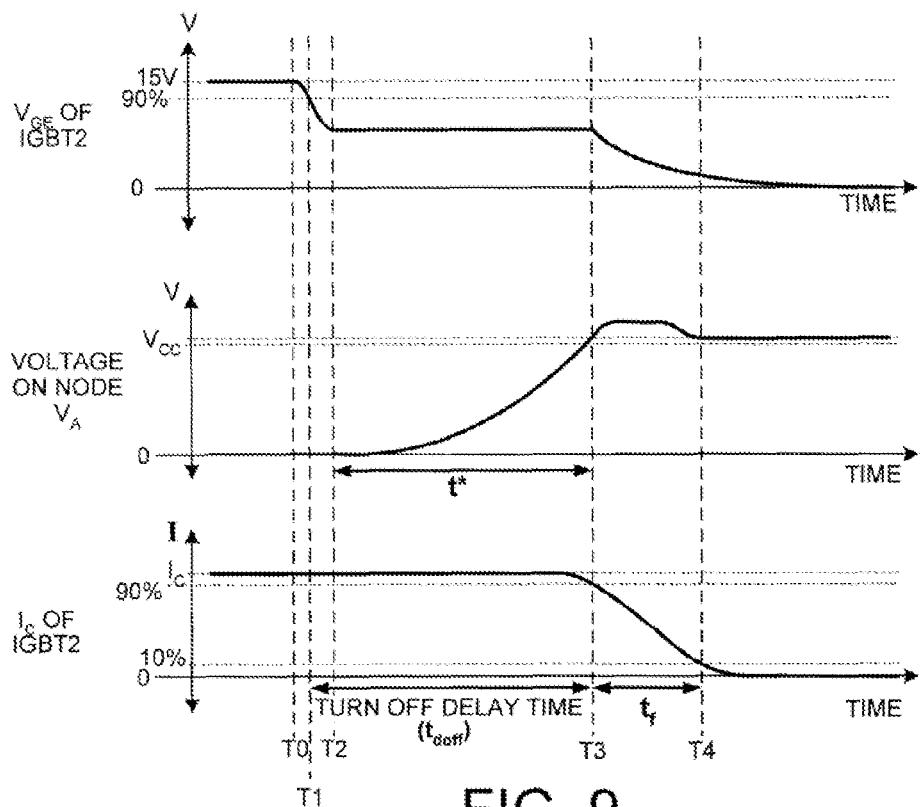
FIG. 9 is a waveform diagram that shows voltage and current waveforms for one of the IGBTs in the circuit of FIG. 8.

A third problem with the prior art IGBT structure is described in connection with FIG. 8, FIG. 9 and FIG. 10. FIG. 8 sets forth an example of a motor drive circuit involving six of the IGBT devices 78-83, six diodes D1-D6, and a motor 84. The motor 84 has three windings A, B and C. Initially, the IGBT device 79 may be on and conducting. Current flows from the center node 85 of motor 84, through winding A, and along current path 86, through conductive IGBT 79, and to node 87. The IGBT 79 is then to be turned off starting at time T0. When the $V_{GE}$ of IGBT 79 drops below its threshold voltage, the IGBT 79 begins to turn off. Current flowing out of winding A is, however, substantially constant during this switching time. The collector current $I_C$ flowing through IGBT 79 cannot, therefore, decrease so the voltage on the node $V_A$ increases. When the voltage on node $V_A$ exceeds the threshold voltage of diode D1 at around time T3, the diode D1 starts to conduct current. This diode current flows up through current path 88 and through diode D1, so that the overall magnitude of current flowing out of winding A remains constant. As the diode current increases, the collector current $I_C$ of IGBT 79 can decrease. The collector current $I_C$ decreases to 10% of its maximum amount by time T4. Time T1 is a time when $V_{GE}$ has dropped to 90% of its initial value. The so-called turn-off delay time $t_{doff}$ is from time T1 until time T3, where T3 is the time when the collector current has dropped to ninety percent of its maximum value. The turn off fall time $t_f$ is from time T3 until time T4, where T4 is the time when the collector current has dropped to ten percent of its maximum value. The time between time T1 and time T3 is denoted t*. Reducing the overall turn off delay time in the circuit of FIG. 8 is desirable because it reduces switching losses.

Figure 10:
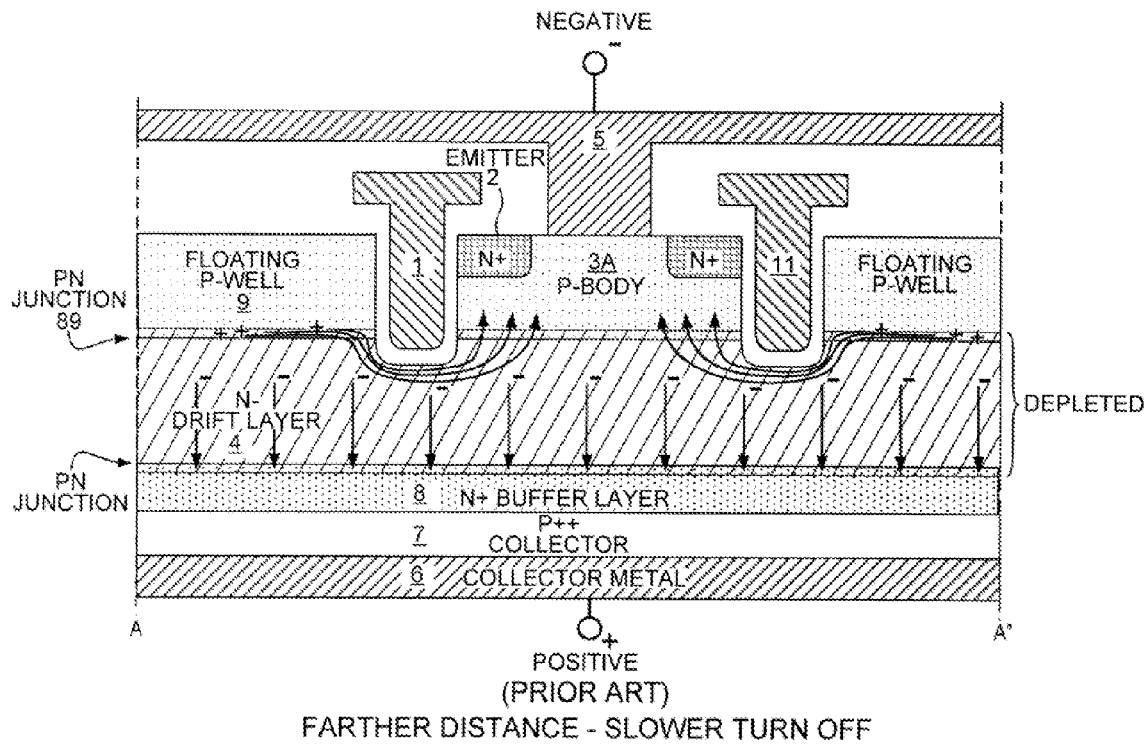
FIG. 10 is a cross-sectional diagram that illustrates how holes are removed from a floating P-well in a prior art IGBT when the IGBT is being turned off.
Figure 11:
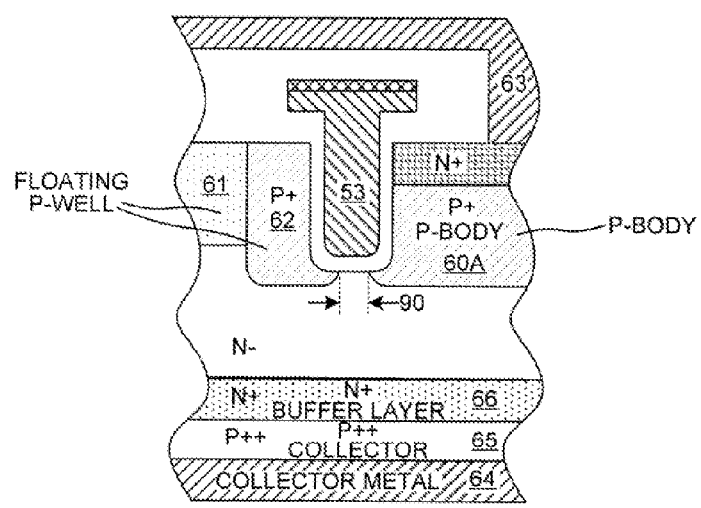
FIG. 11 is a diagram that shows how holes from the floating P-well of the novel IGBT have a shorter distance to travel to get to the P-body region upon IGBT turn off, as compared to the prior art situation depicted in FIG. 10.

FIG. 10 is a cross-sectional diagram of the prior art trench IGBT of FIGS. 1A, 1B and 1C during the time t*. During this time, the PN junction 89 between the P body region 3A and the N– drift region 4 is being put under a reverse voltage, so a first depletion region is being formed on the top side of the PN junction up into the P type material of the floating P-well 9 and up into the P type material of the P-body region 3A. At the same time, a second depletion region is being formed from the JN junction 89 down into the N– drift layer 4. The majority carriers in the P type material of the floating P-well 9 are holes. Accordingly, for the first depletion region to form in the floating P-well 9, holes from this region of the floating P-well 9 must be removed. Because the floating P-well is floating, these holes must flow under the trench in order to escape to the relative negative P-body region 3A, so that they can flow on up to the metal emitter terminal 5. The speed at which the depletion regions form determines the time t*. The overall turn off speed of the IGBT is therefore limited by the amount of time required to remove these holes from the depletion region forming in the floating P-well. The long paths the holes must take from the floating P-well 9, under the trench, and to the P-body region 3A as illustrated in FIG. 10 serve to slow the turn off of the IGBT. As illustrated in FIG. 11, the novel trench IGBT structure 50 of FIG. 2A, FIG. 2B and FIG. 2C provides a reduced distance 90 that holes have to travel from the floating P-well 61/62 to the P-body region 60A. As a result, formation of the depletion region in the floating P-well 61/62 occurs faster, the IGBT 50 has a shorter t* time, and consequently the IGBT 50 has a faster overall turn off time.

Figure 12:
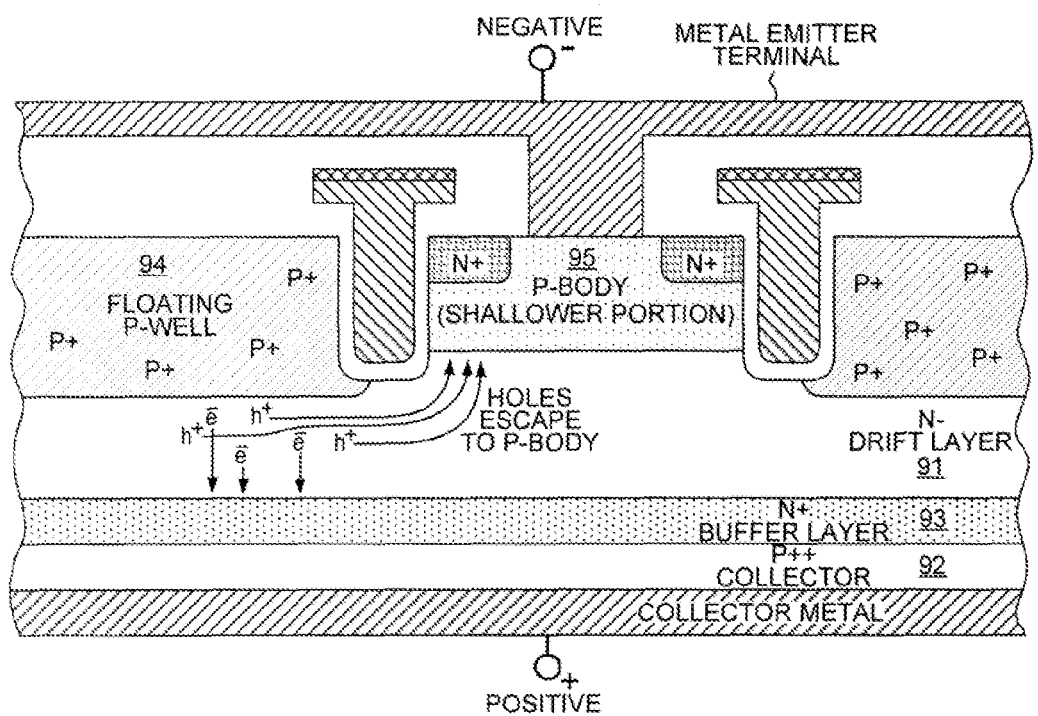
FIG. 12 is a cross-sectional diagram of an IGBT in the steady on state, where the floating P-well of the IGBT has a planar interface with the N− drift layer below.
Figure 13:
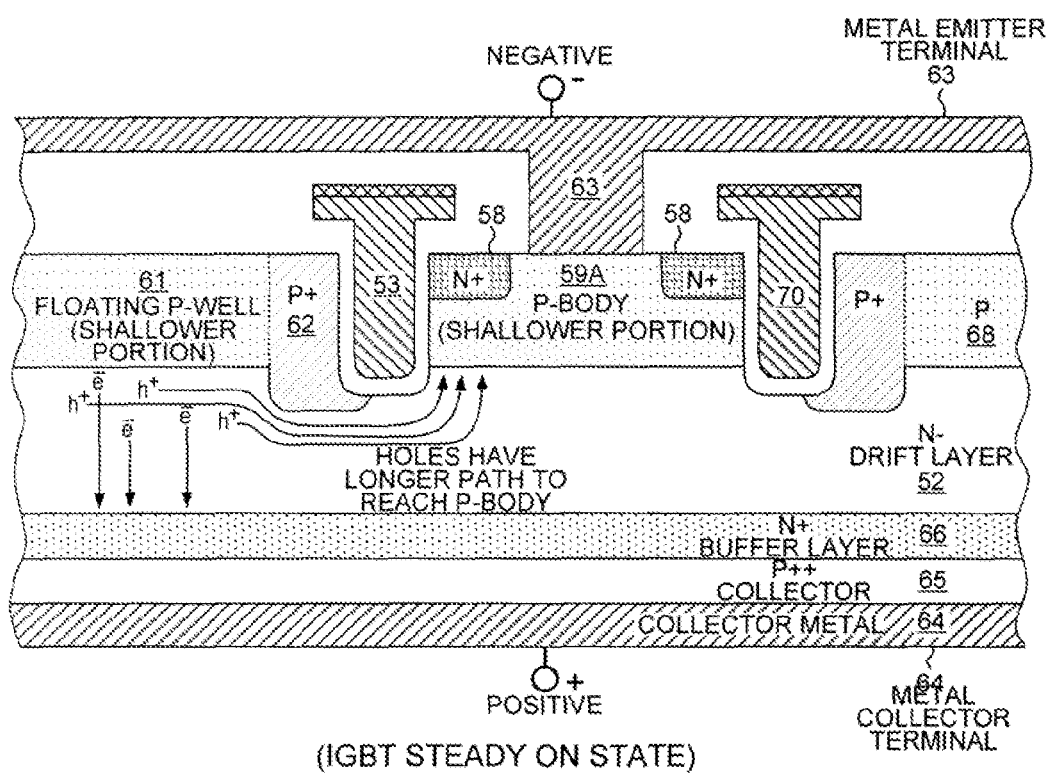
FIG. 13 is a cross-sectional diagram of the novel trench IGBT of FIG. 2A, FIG. 2B and FIG. 2C in the steady on state, where the floating P-well has a tub-shape that helps prevent the escape of holes from N− drift layer material under the floating P-well.

A fourth problem with the prior art IGBT structure is described in connection with FIG. 12. In the steady on state of the IGBT, it is desirable to maintain a high concentration of holes in the N– drift layer 91. Even though the current carrying capacity of the device is due both to electron flow from the emitter to the N– drift layer, and due to hole flow in the opposite direction from the P++ collector layer 92 to the N+ buffer layer 93, it is preferable to prevent the escape of holes from the N– drift layer 91. This may reduce the contribution to overall current flow due to holes, but it increases the flow of electrons even more. Holes are injected into the N– drift layer 91 from the P++ collector layer 92 across the entire bottom of the device. Holes that might be under the floating P-well 94 may escape from the N– drift layer 91 by passing under the trench and to the P-body layer 95 as illustrated. As illustrated in FIG. 13, the tub shape of the floating P-well 61/62 of the novel trench IGBT structure 50 of FIG. 2A, FIG. 2B and FIG. 2C makes it more difficult for holes under the floating P-well 61/62 to escape. As compared to the case of FIG. 12 where the bottom surface of the floating P-well 94 is planar and where holes under the floating P-well 94 have a shorter distance to travel to reach the P-body region 95, holes that are under the floating P-well 61/62 in the case of the structure of FIG. 13 have a longer path to reach the P-body region 59A. The peripheral deeper P+ type portion 62 of the floating P-well acts as a fence or obstruction to help hold the holes in and under the shallower portion 61 of the floating P-well. The escape of holes from the N– drift layer 52 is therefore reduced, and conductivity modulation of the IGBT is improved.

Although certain specific embodiments are described above for instructional purposes, the teachings of this patent document have general applicability and are not limited to the specific embodiments described above. Although a cell structure having octagonal trenches is described above, in other examples tub-shaped floating P-wells can be surrounded by elongated structures such as octagons that are elongated in one dimension. The tub-shaped floating P-wells may be incorporated into a stripe-trench IGBT layout. Although an example is described above where each floating P-well has four hole drains to deep P-body regions, in other embodiments each floating P-well has another number of hole drains. In an elongated cell or stripe layout, a row of deep P-body regions may be disposed along a strip-shaped shallow P-body region so that each of the deep P-body regions acts as a hole drain. Although an example is described above where the tub-shaped floating P-well has a peripheral deeper P+ type portion that only forms a curtain at the periphery of a central shallower P type portion of the floating P-well, in other examples the deeper P+ type portion of the floating P-well may also divide up the tub into multiple smaller tubs. One or more strips of the deeper P+ type portion of the floating P-well may, for example, extend across a non-peripheral part of the tub so as to split the tub into two parts. Accordingly, various modifications, adaptations, and combinations of various features of the described embodiments can be practiced without departing from the scope of the invention as set forth in the claims.

What is claimed is:

1. A trench Insulated Gate Bipolar Transistor (IGBT) die structure comprising:
   a P type collector layer;
   an N– type drift layer disposed over the P type collector layer;
   a trench that extends a first distance toward the N– type drift layer from a substantially planar upper semiconductor surface, wherein the trench has an inner sidewall and an outer sidewall and a bottom wall, and wherein the N– type drift layer forms at least a portion of the bottom wall;
   a P type body region that has a plurality of deeper portions and a plurality of shallower portions, wherein each deeper portion extends a second distance into the N– type drift layer from the substantially planar upper semiconductor surface, wherein each deeper portion forms a part of the outer sidewall of the trench, wherein each shallower portion extends a third distance into the N– type drift layer from the substantially planar upper semiconductor surface, wherein each shallower portion forms a part of the outer sidewall of the trench, wherein the second distance is greater than the third distance, and wherein the second distance is greater than the first distance;
   an N+ type emitter region, wherein the N+ type emitter region extends into the P type body region from the substantially planar upper semiconductor surface, wherein the N+ type emitter region rings the trench and forms a part of the outer sidewall of the trench;
   a floating P type well region that extends into the N– type drift layer from the substantially planar upper semiconductor surface, wherein the floating P type well region has a peripheral deeper portion that extends the second distance from the substantially planar upper semiconductor surface toward the N– type drift layer, wherein the floating P type well region has a central shallower portion that extends the third distance from the substantially planar upper semiconductor surface toward the N– type drift layer, wherein the peripheral deeper portion of the floating P type well region rings the central shallower portion of the floating P type well region and extends along the inner sidewall of the trench;
   a gate insulating film covering a surface of the trench;
   a trench gate electrode disposed on the gate insulating film;
   a first metal terminal that is coupled to the P type body region;
   a second metal terminal that is coupled to the trench gate electrode; and
   a third metal terminal that is coupled to the P type collector layer.

2. The trench IGBT die structure of claim 1, wherein the floating P type well region is octagonal, and wherein the trench rings the floating P type well region.

3. The trench IGBT die structure of claim 2, wherein the P type body region rings the trench.

4. The trench IGBT die structure of claim 1, wherein there is no electrical contact between the floating P type well region and the first metal terminal, wherein there is no electrical contact between the floating P type well region and the second metal terminal, and wherein there is no electrical contact between the floating P type well region and the third metal terminal.

5. The trench IGBT die structure of claim 1, wherein a first deeper portion of the P type body region forms a first part of the outer sidewall of the trench, wherein a first shallower portion of the P type body region forms a second part of the outer sidewall of the trench, wherein a second deeper portion of the P type body region forms a third part of the outer sidewall of the trench, wherein a second shallower portion of the P type body region forms a fourth part of the outer sidewall of the trench, wherein a third deeper portion of the P type body region forms a fifth part of the outer sidewall of the trench, wherein a third shallower portion of the P type body region forms a sixth part of the outer sidewall of the trench, wherein a fourth deeper portion of the P type body region forms a seventh part of the outer sidewall of the trench, wherein a fourth shallower portion of the P type body region forms an eighth part of the outer sidewall of the trench.

6. The trench IGBT die structure of claim 1, further comprising:
an N+ type buffer layer that is disposed between the P type collector layer and the N– drift layer.

7. The trench IGBT die structure of claim 1, wherein the trench has a width, and wherein a distance between a deeper portion of the P type body region and the peripheral deeper portion of the floating P type well region is smaller than the width of the trench.

8. The trench IGBT die structure of claim 1, wherein a portion of the floating P type well region extends under a portion of the bottom wall of the trench.

9. The trench IGBT die structure of claim 1, wherein a portion of each deeper portion of the P type body region extends under a portion of the bottom wall of the trench.

10. The trench IGBT die structure of claim 1, wherein there is no N type semiconductor region that extends into the floating P type well region from the substantially planar upper semiconductor surface.

11. The trench IGBT die structure of claim 1, wherein a bottom of the central shallower portion of the floating P type well region forms a substantially planar octagonal PN junction with the N– type drift layer.

12. A trench Insulated Gate Bipolar Transistor (IGBT) die comprising:
a P type collector layer;
an N– type drift layer;
a trench that extends a first distance toward the N– type drift layer from an upper semiconductor surface of the die;
a gate insulating film covering a surface of the trench;
a trench gate electrode disposed on the gate insulating film;
a P type body region that extends from the upper semiconductor surface into the N– type drift layer, wherein a portion of the P type body region extends under a first portion of the trench;
an N+ type emitter region that extends from the upper semiconductor surface into the P type body region;
a floating P type well region that extends into the N– type drift layer from the upper semiconductor, wherein the floating P type well region has a peripheral deeper portion that extends a second distance from the upper semiconductor surface toward the N– type drift layer, wherein the second distance is greater than the first distance, wherein the floating P type well region also has a central shallower portion that extends a distance smaller than the second distance from the upper semiconductor surface toward the N– type drift layer, wherein the peripheral deeper portion of the floating P type well region rings the central shallower portion of the floating P type well region and extends along a sidewall of the trench, wherein a portion of the floating P type well region extends under a second portion of the trench;
a first metal terminal that is coupled to the P type body region;
a second metal terminal that is coupled to the trench gate electrode; and
a third metal terminal that is coupled to the P type collector layer.

13. The trench IGBT die of claim 12, wherein a bottom of the central shallower portion of the floating P type well region forms a substantially planar octagonal PN junction with the N– type drift layer.

14. The trench IGBT die of claim 12, wherein an N+ type buffer layer is disposed between the P type collector layer and the N– type drift layer.

15. The trench IGBT die of claim 12, wherein there are multiple separate P+ type portions of the P type body region each of which extends under a separate outer portion of the bottom of the trench.

16. The trench IGBT die of claim 12, wherein the P type body region includes P+ type portions and P type portions, wherein P+ type semiconductor material of the P+ type portions of the P type body region forms some parts of an outer sidewall of the trench, and wherein P type semiconductor material of the P type portions of the P type body region forms other parts of the outer sidewall of the trench.

17. A trench Insulated Gate Bipolar Transistor (IGBT) die comprising:
a collector layer;
a drift layer;
a trench that extends down into the die from an upper semiconductor surface of the die;
a gate insulating film covering a surface of the trench;
a trench gate electrode disposed on the gate insulating film;
a P type body region that extends from the upper semiconductor surface into the drift layer, wherein first parts of an outer sidewall of the trench are semiconductor material of the P type body region;
an emitter region that extends from the upper semiconductor surface into the P type body region, wherein a second part of the outer sidewall of the trench is semiconductor material of the emitter region;
a first metal terminal that is coupled to the P type body region;
a second metal terminal that is coupled to the trench gate electrode;
a third metal terminal that is coupled to the collector layer; and
means for retaining holes in a steady on state of the IGBT and for draining holes to the P type body region during a turn off of the IGBT, wherein the means comprises a central shallower portion and a peripheral deeper portion, wherein the means is not electrically connected to any one of the first, second and third metal terminals, wherein the central shallower portion of the means is a region of P type semiconductor material, and wherein the peripheral deeper portion of the means is a region of P+ type semiconductor material, and wherein no N type semiconductor material extends into the means from the upper semiconductor surface.

18. The trench IGBT die of claim 17, wherein a portion of the means for retaining and draining holes extends under a portion of a bottom wall of the trench.

19. The trench IGBT die of claim 17, wherein the P type body region comprises a plurality of shallower portions and a means for receiving draining holes, wherein the means for receiving draining holes of the P type body region during the turn off of the IGBT receives holes that are draining from the means for retaining and draining holes.

* * * * *